US011522482B2

(12) United States Patent
Hagimori et al.

(10) Patent No.: US 11,522,482 B2
(45) Date of Patent: Dec. 6, 2022

(54) MOTOR DRIVING CIRCUIT AND MOTOR DRIVING DEVICE

(71) Applicants: Hitoshi Hagimori, Tokyo (JP); Itsuki Nakano, Tokyo (JP)

(72) Inventors: Hitoshi Hagimori, Tokyo (JP); Itsuki Nakano, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/645,129

(22) Filed: Dec. 20, 2021

(65) Prior Publication Data

US 2022/0115972 A1 Apr. 14, 2022

Related U.S. Application Data

(63) Continuation of application No. 16/565,993, filed on Sep. 10, 2019, now Pat. No. 11,239,781.

(30) Foreign Application Priority Data

Sep. 21, 2018 (JP) .............................. JP2018-177898

(51) Int. Cl.
*H02P 21/22* (2016.01)
*H02P 29/60* (2016.01)
(Continued)

(52) U.S. Cl.
CPC ........ *H02P 21/22* (2016.02); *G01R 19/16571* (2013.01); *G01R 19/32* (2013.01);
(Continued)

(58) Field of Classification Search
CPC .................... H02P 21/22; H02P 29/60; G01R 19/16571; G01R 19/32; H05K 1/181; H05K 2201/1009; H05K 2201/10151
See application file for complete search history.

(56) References Cited

U.S. PATENT DOCUMENTS

| 10,323,961 | B2 | 6/2019 | Sun et al. | |
|---|---|---|---|---|
| 2011/0000652 | A1* | 1/2011 | Takada | H02P 6/085 165/104.34 |
| 2013/0307453 | A1* | 11/2013 | Sugie | H03G 3/30 318/400.32 |

(Continued)

FOREIGN PATENT DOCUMENTS

| JP | H07-098339 | 4/1995 |
|---|---|---|
| JP | H08-223786 | 8/1996 |

(Continued)

OTHER PUBLICATIONS

Office Action dated Jun. 21, 2022 with respect to the corresponding Japanese patent application No. JP2018-177898.

*Primary Examiner* — Zoheb S Imtiaz
(74) *Attorney, Agent, or Firm* — IPUSA, PLLC

(57) ABSTRACT

A motor driving circuit includes a wiring pattern formed in a circuit board, which is configured such that electrical current flowing into a motor flows through the wiring pattern; and a current measurement circuit configured to measure an amount of electrical current flowing through the wiring pattern, based on an amount of voltage drop occurring in response to flowing of the electrical current. The motor driving circuit includes a drive unit configured to adjust a current measurement value measured by the current measurement circuit, based on first adjustment data that compensates for variation in resistance of the wiring pattern caused by an individual difference in the circuit board, and to drive the motor based on an adjusted current value which is the adjusted current measurement value.

15 Claims, 5 Drawing Sheets

(51) Int. Cl.
*H05K 1/18* (2006.01)
*G01R 19/165* (2006.01)
*G01R 19/32* (2006.01)

(52) U.S. Cl.
CPC ............ *H02P 29/60* (2016.02); *H05K 1/181* (2013.01); *H05K 2201/1009* (2013.01); *H05K 2201/10151* (2013.01)

(56) References Cited

U.S. PATENT DOCUMENTS

| | | | | |
|---|---|---|---|---|
| 2014/0176742 | A1* | 6/2014 | Nakayama | ....... H04N 5/232411 |
| | | | | 359/554 |
| 2016/0138549 | A1* | 5/2016 | Kuniyoshi | ................ H02P 1/04 |
| | | | | 290/38 R |
| 2017/0373488 | A1* | 12/2017 | Saito | ................... H05K 1/0201 |
| 2018/0131309 | A1 | 5/2018 | Sun et al. | |
| 2018/0149705 | A1 | 5/2018 | Hagimori et al. | |

FOREIGN PATENT DOCUMENTS

| | | |
|---|---|---|
| JP | 2009-052898 | 3/2009 |
| JP | 2018-084559 | 5/2018 |
| JP | 2018-093707 | 6/2018 |
| JP | 2018-102112 | 6/2018 |

\* cited by examiner

MOTOR DRIVING CIRCUIT AND MOTOR DRIVING DEVICE

CROSS-REFERENCE TO RELATED APPLICATION

The present application is a continuation application of and claims priority under 35 U.S.C. 120 to U.S. patent application Ser. No. 16/565,993, filed on Sep. 10, 2019, which is based on and claims priority to Japanese Patent Application No. 2018-177898 filed on Sep. 21, 2018. The contents of these applications are incorporated herein by reference in their entirety.

BACKGROUND OF THE INVENTION

1. Field of the Invention

The present invention relates to a motor driving circuit and a motor driving device, which measure current flowing through a wiring pattern formed on a circuit board, and which drive a motor based on the measured current value.

In the motor driving circuit that drives the motor, it is necessary to accurately detect an amount of electrical current (hereinafter may be referred to as a "current value") flowing to the motor, in order to prevent occurrence of adverse effects caused by overcurrent in a motor, such as an increase in motor speed and abnormal heat generation of a motor. Patent Document 1 discloses a technique for detecting an amount of current flowing through a wiring pattern on a circuit board, by detecting voltage drop occurring in a particular section of the wiring pattern.

However, electrical resistance of a wiring pattern formed on a circuit board varies because of circuit board individual difference, and also varies depending on a temperature characteristic of the wiring pattern. Thus, it is difficult to accurately measure an amount of current flowing through a wiring pattern in the technique disclosed in Patent Document 1. Therefore, there has been a problem that a motor driving circuit that drives a motor based on a current value measured from a wiring pattern cannot further improve accuracy of drive control of the motor.

In view of the above, the present invention is intended to provide a motor driving circuit capable of improving accuracy of drive control of a motor and suppressing abnormal heat generation and damage of the motor.

CITATION LIST

Patent Document

[Patent Document 1] Japanese Laid-open Patent Application Publication No. 07-98339

SUMMARY OF THE INVENTION

A motor driving circuit according to an aspect of the present invention includes a wiring pattern formed in a circuit board, which is configured such that electrical current flowing into a motor flows through the wiring pattern; and a current measurement circuit configured to measure an amount of electrical current flowing through the wiring pattern, based on an amount of voltage drop caused by the electrical current flowing through the wiring pattern. The motor driving circuit includes a drive unit configured to adjust a current measurement value measured by the current measurement circuit, based on first adjustment data that compensates for variation in resistance of the wiring pattern caused by an individual difference in the circuit board, and to drive the motor based on an adjusted current value which is the adjusted current measurement value.

DETAILED DESCRIPTION OF THE PREFERRED EMBODIMENTS

Hereinafter, a configuration of a motor driving circuit and a motor driving device according to embodiments of the present disclosure will be described in detail with reference to the drawings. It should be noted that the present invention is not limited by these embodiments.

First Embodiment

Figure 1:
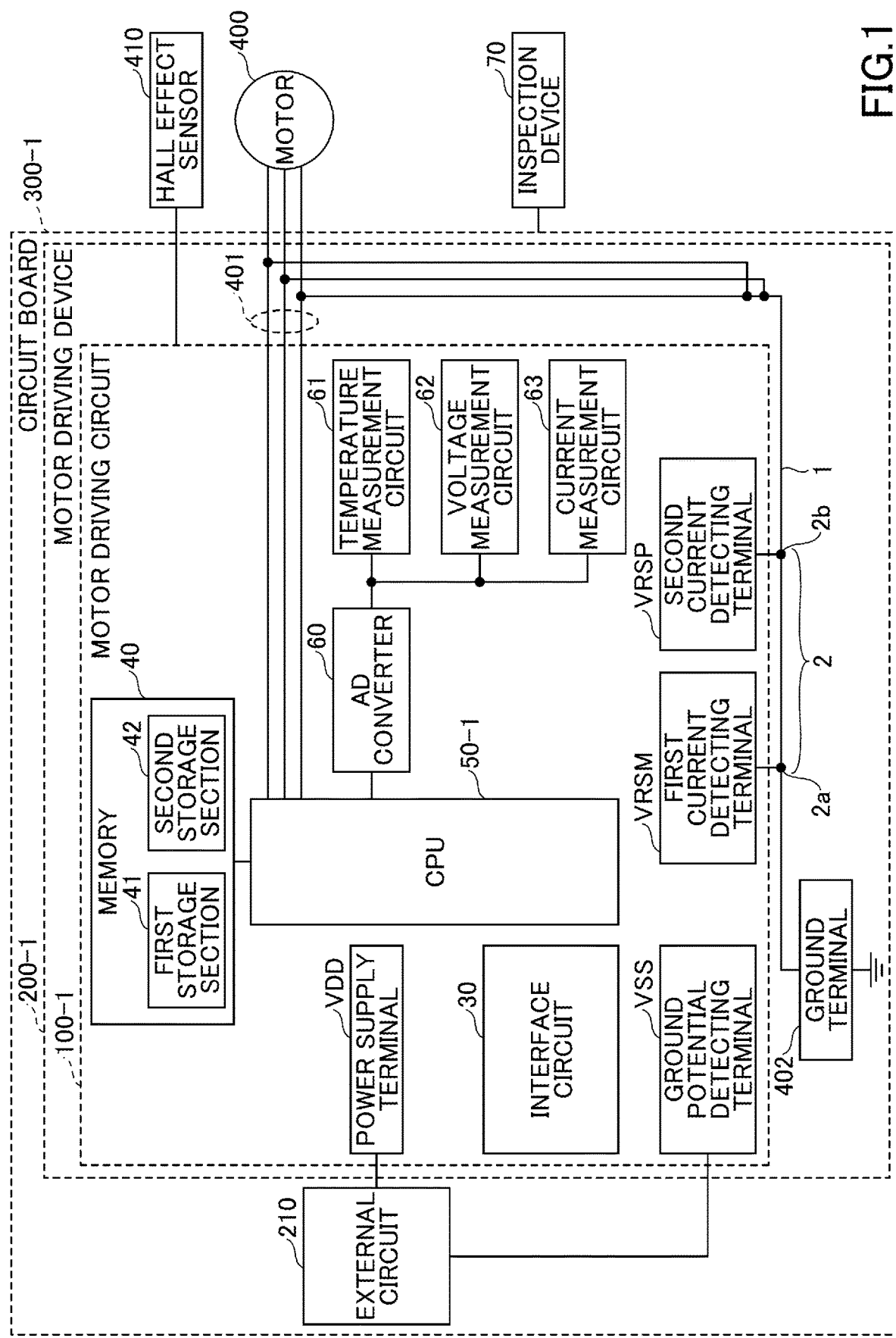
FIG. 1 is a diagram illustrating a configuration of a motor driving device according to a first embodiment of the present disclosure.

FIG. 1 is a diagram illustrating a configuration of a motor driving device according to an embodiment 1 of the present disclosure. On a circuit board 300-1 illustrated in FIG. 1, a motor driving device 200-1 according to the first embodiment and an external circuit 210 are provided. The circuit board 300-1 is a printed circuit board made from glass epoxy for example. The motor driving device 200-1 includes a motor driving circuit 100-1 that measures electrical current (may be simply referred to as "current") flowing through a wiring pattern 1 formed on the circuit board 300-1, and that drives a motor 400 based on an amount of current measured (an amount of current may also be referred to as a "current value"). The wiring pattern 1 is a copper foil pattern formed on the circuit board 300-1. One end of the wiring pattern 1 is connected to the motor wiring 401, and the other end of the wiring pattern 1 is grounded via the ground terminal 402. One end of the motor wiring 401 is connected to a CPU 50-1, and the other end of the motor wiring 401 is connected to the motor 400. For example, three-phase AC current is transmitted in the motor wiring 401. The motor 400 includes a rotor (not illustrated). A rotational position, rotation angle, and the like of the rotor are detected by a Hall effect sensor 410 (may also be referred to as a "Hall sensor") which is a magnetic sensing element. The detected position information, angle information, and the like are input to the CPU 50-1, and are used for drive control of the motor 400.

The motor driving circuit 100-1 includes, as internal circuits, an interface circuit 30, a memory 40, the CPU 50-1, an analog-to-digital (AD) converter 60, a temperature measurement circuit 61, a voltage measurement circuit 62, and a current measurement circuit 63. These internal circuits are operated by power supply voltage applied between a power supply terminal VDD and a ground potential detecting terminal VSS, from the external circuit 210.

In the temperature measurement circuit 61, a temperature of an integrated circuit (IC) constituting the motor driving circuit 100-1 is measured periodically for example, and temperature information representing the measured temperature is output as a temperature measurement value.

The voltage measurement circuit 62 includes a resistive element that divides voltage applied between the power supply terminal VDD and the ground potential detecting terminal VSS. By using the resistive element, magnitude of the voltage applied between the power supply terminal VDD and the ground potential detecting terminal VSS is measured, and voltage information representing the measured magnitude of the voltage is output as a voltage measurement value.

The current measurement circuit 63 includes an amplifier that amplifies a difference between an electric potential at a first current detecting terminal VRSM connected to the wiring pattern 1 and an electric potential at a second current detecting terminal VRSP connected to the wiring pattern 1, and the current measurement circuit 63 outputs a current measurement value corresponding to an output value of the amplifier. Specifically, the current measurement circuit 63 measures the electric potential at the first current detecting terminal VRSM and the electric potential at the second current detecting terminal VRSP, and calculates a difference (potential difference) between these two electric potentials. The current measurement circuit 63 obtains an amount of voltage drop on a specific section 2 (to be described below), by amplifying this potential difference. The specific section 2 corresponds to a part of the wiring pattern 1 that starts from a first connecting point 2a and ends at a second connecting point 2b. The first connecting point 2a is a connecting point at which the first current detecting terminal VRSM is connected with the wiring pattern 1. The second connecting point 2b is a connecting point at which the second current detecting terminal VRSP is connected with the wiring pattern 1. The second current detecting terminal VRSP (i.e. second connecting point 2b) is provided at a position on the wiring pattern 1 at a predetermined distance from the first connecting point 2a. A resistance value of the specific section 2 is determined by electrical resistivity of metallic material constituting the wiring pattern 1, a length of the wiring pattern 1, a width of the wiring pattern 1, a thickness of the wiring pattern 1, and the like. The current measurement circuit 63 estimates an amount of current flowing through the wiring pattern 1 based on the obtained amount of voltage drop, and outputs, as a current measurement value, current information representing the estimated amount of current.

The AD converter 60 converts an analog temperature measurement value output from the temperature measurement circuit 61 to a digital value, and outputs this digital value to the CPU 50-1. Similarly, the AD converter 60 converts an analog voltage measurement value output from the voltage measurement circuit 62 to a digital value, and converts an analog current measurement value output from the current measurement circuit 63 to a digital value.

The memory 40 is a non-volatile memory that stores adjustment data to compensate for variation in a resistance value of the specific section 2 in the wiring pattern 1. If a resistance value of the specific section 2 varies, voltage drop in the specific section 2 varies even though the current flowing through the wiring pattern 1 does not change. If the voltage drop varies, a current measurement value also varies. Therefore, an error occurs in a calculation result for the motor control performed, in the CPU 50-1, based on the current measurement value. In order to prevent such an error from occurring, adjustment data for compensating for the resistance value variation is stored in the memory 40 in advance. The adjustment data may be stored into the memory 40 by the inspection device 70 after the motor driving circuit 100-1 is implemented into the circuit board 300-1 for example, or the adjustment data may be stored in the memory 40 in advance before the motor driving circuit 100-1 is implemented into the circuit board 300-1.

The memory 40 includes a first storage section 41 and a second storage section 42. The first storage section 41 stores first adjustment data that is individual difference compensation data. The individual difference compensation data is data to compensate for resistance variation in the specific section 2 of wiring pattern 1 caused by individual variation in the circuit board 300-1. The first adjustment data includes one or more types of first adjustment data. The second storage section 42 stores second adjustment data that is temperature compensation data. The temperature compensation data is data to compensate for the variation in resistance value in the specific section 2 caused by a temperature characteristic of the wiring pattern 1. The second amendment data includes one or more types of second adjustment data.

The CPU 50-1 acquires a voltage measurement value, a current measurement value, and a temperature measurement value output from the AD converter 60. The CPU 50-1 reads out the first adjustment data from the first storage section 41 and reads out the second adjustment data from the second storage section 42.

The CPU 50-1 is a drive unit configured to drive the motor 400. The CPU 50-1 adjusts the current measurement value, and drives the motor 400 based on an adjusted current value which is the current measurement value after adjustment. Arithmetic operations such as the adjustment are embodied by, for example, the CPU 50-1 executing firmware stored in the memory 40. The CPU 50-1 may be configured to output information representing the adjusted current value to the interface circuit 30. The interface circuit 30 is an example of a communication interface circuit. An example of the interface circuit 30 is a serial communication interface circuit in accordance with I$^2$C (Inter-Integrated Circuit). The interface circuit 30 converts the information representing the adjusted current value that is output from the CPU 50-1 into a specific format, and outputs the converted information. Thus, the information representing the adjusted current value that is output from the CPU 50-1 is provided to the external circuit 210.

Figure 2:
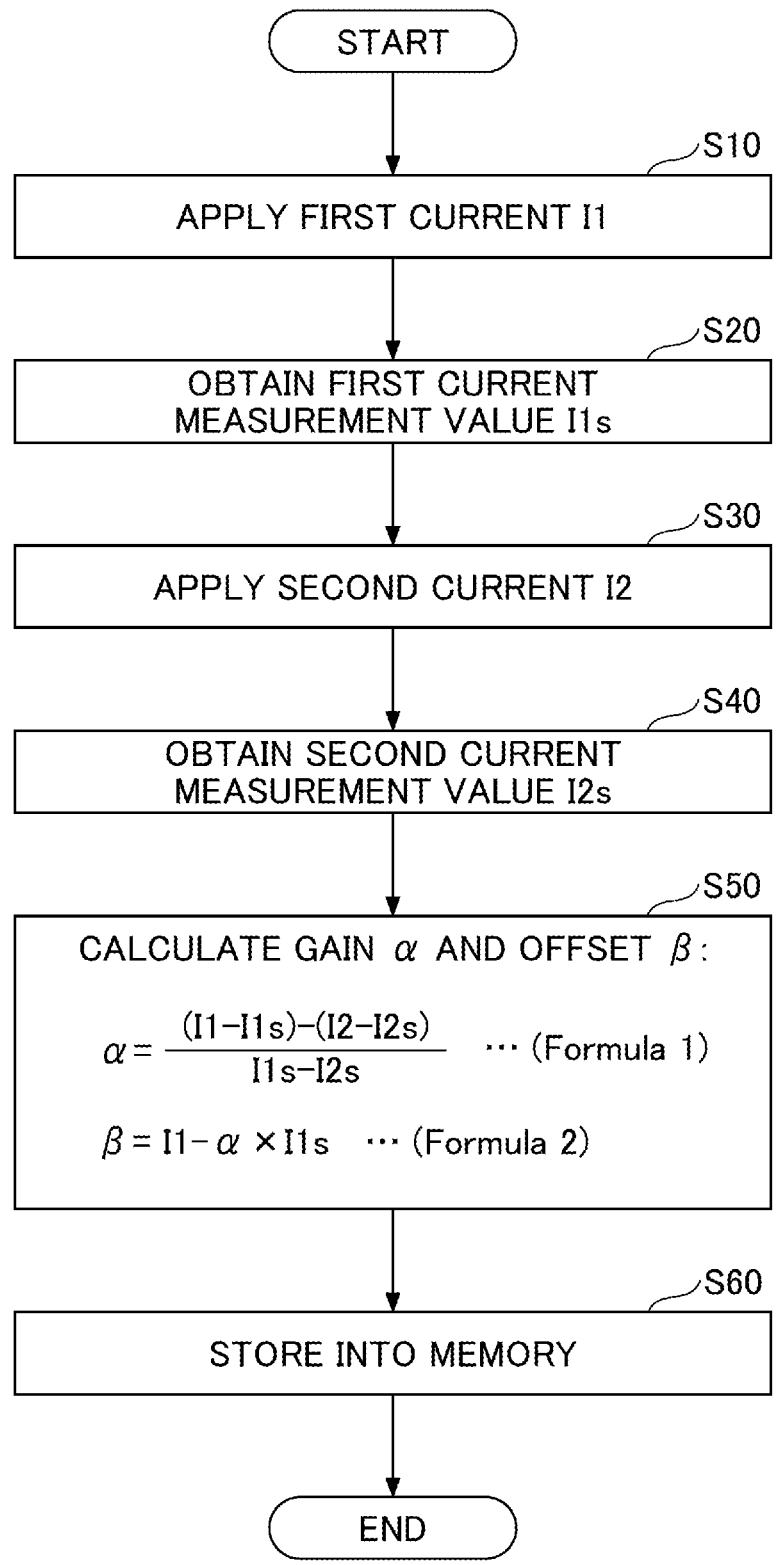
FIG. 2 is a flowchart illustrating a flow of a calculation process of first adjustment data and a process of storing the first adjustment data in a first storage section.

Next, a process of calculating the first adjustment data and a process of storing the first adjustment data into the first storage section 41 will be described. FIG. 2 is a flowchart illustrating a flow of the process of calculating the first adjustment data and the process of storing the first adjustment data in the first storage section. Each of the processes illustrated in FIG. 2 is performed one or more times by, for example, the inspection device 70, during an inspection process performed before shipment of the circuit board 300-1 in which the motor driving circuit 100-1 is implemented. It should be noted that implementation of the motor driving circuit 100-1 into the circuit board 300-1 is performed under an environment in which an ambient temperature of the circuit board 300-1 is constant, such as 25° C.

At step S10, the inspection device 70 causes electrical current to flow through the specific section 2 so that first current I1 of a desired current value flows through the specific section 2, by applying voltage, for example, between the motor wiring 401 and the ground terminal 402.

At step S20, while the first current I1 is flowing, the inspection device 70 acquires, from the interface circuit 30, a first current measurement value I1s acquired by the CPU 50-1 from the AD converter 60.

At step S30, the inspection device 70 causes electrical current to flow through the specific section 2 so that second current I2 of a desired current value flows through the specific section 2, by applying voltage, for example, between the motor wiring 401 and the ground terminal 402. The value of the second current I2 is greater than, for example, the value of the first current I1.

At step S40, while the second current I2 is flowing, the inspection device 70 acquires, from the interface circuit 30, a second current measurement value I2s acquired by the CPU 50-1 from the AD converter 60.

Figure 3:
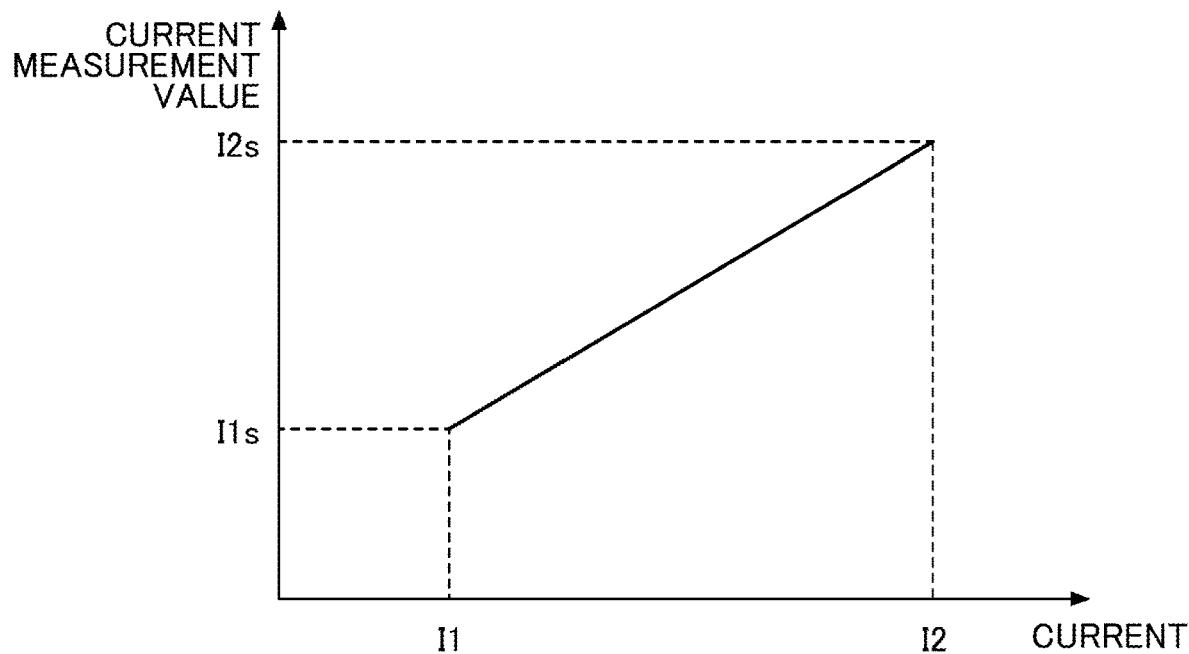
FIG. 3 is a diagram illustrating a relationship between an amount of current and its measured value.

FIG. 3 is a graph illustrating a relationship between current and the current measurement value. A horizontal axis indicates an amount of current flowing through the specific section 2 when voltage is applied between the motor wiring 401 and the ground terminal 402. I1 in FIG. 3 represents a value of the above-described first current. I2 in FIG. 3 represents a value of the above-described second current. The vertical axis indicates the current measurement value obtained by the CPU 50-1. I1s in FIG. 3 represents the above-described first current measurement value. I2s in FIG. 3 represents the above-described second current measurement value. As illustrated in FIG. 3, in the inspection device 70, the first current measurement value I1s corresponding to the value of the first current I1 and the second current measurement value I2s corresponding to the value of the second current I2 are detected. As illustrated in FIG. 3, the first current measurement value I1s and the second current measurement value I2s are different.

Referring back to FIG. 2, at step S50, the inspection device 70 substitutes the value of the first current I1, the value of the second current I2, the first current measurement value I1s, and the second current measurement value I2s in Formulas 1 and 2 illustrated in FIG. 2. Accordingly, the inspection device 70 calculates a gain $\alpha$ and an offset $\beta$. The gain $\alpha$ and the offset $\beta$ respectively represent coefficients of Formula 3, which is a linear expression illustrated in FIG. 6 to be described below.

At step S60, the inspection device 70 stores the calculated gain $\alpha$ and offset $\beta$ into the first storage section 41 via, for example, a write terminal (not illustrated) provided at the circuit board 300-1. The inspection device 70 may store the value of the first current I1, the value of the second current I2, the first current measurement value I1s, the second current measurement value I2s, or the like, into the memory 40 via the write terminal. Therefore, after shipment, in the CPU 50-1 provided in the circuit board 300-1, by substituting the gain $\alpha$ and offset $\beta$ stored in the memory 40 and a current measurement value into the Formula 3 illustrated in FIG. 6, which will be described below, the current measurement value is adjusted and an adjusted current value can be obtained (calculated). The adjusted current value obtained by using Formula 3 is referred to as a first adjusted current value Ia.

As described above, even for an error occurring in a current measurement value due to variation in a value of resistance of the wiring pattern 1 that is caused by an individual difference in the circuit board 300-1, in the CPU 50-1, a value of current flowing through the wiring pattern 1 is accurately calculated as the first adjusted current value Ia. Therefore, accuracy of measurement of current flowing through the wiring pattern 1 is improved.

Figure 4:
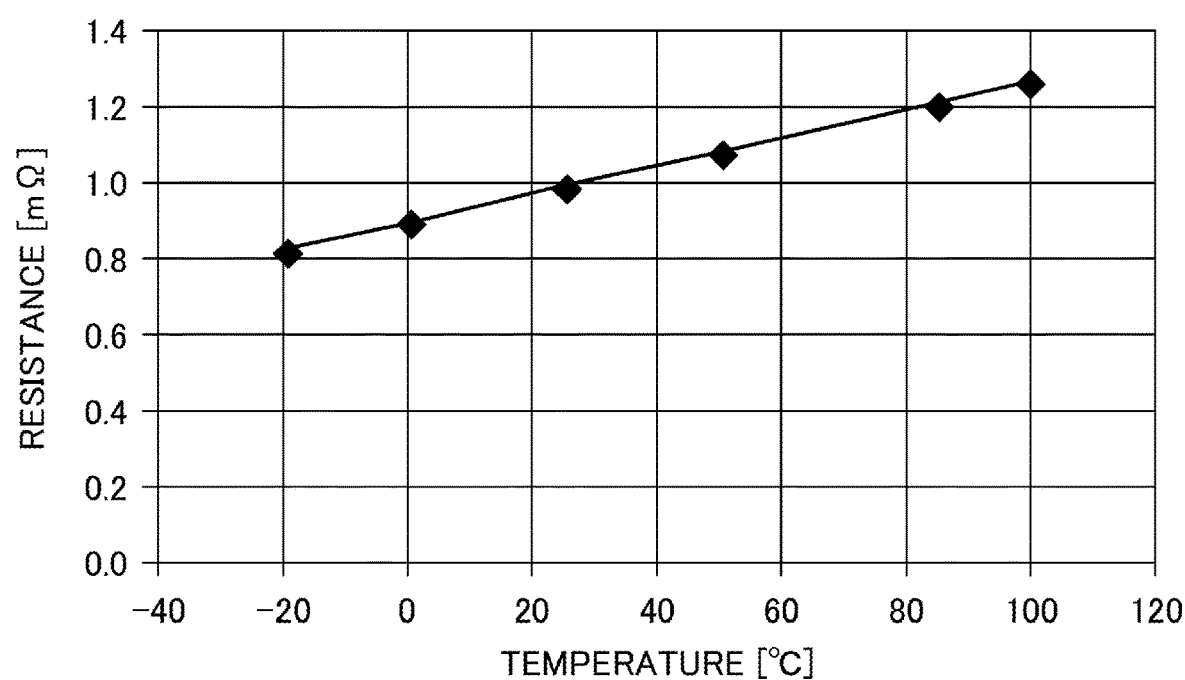
FIG. 4 is a diagram illustrating a temperature characteristic of a wiring pattern.

Next, a process of calculating second adjustment data and a process of storing the second adjustment data into the second storage section 42 will be described. A temperature characteristic of a resistance value in the specific section 2 of the wiring pattern 1 is affected by material of the wiring pattern 1. FIG. 4 is a diagram illustrating the temperature characteristic of the wiring pattern 1. A horizontal axis indicates a temperature of the wiring pattern 1, and a vertical axis represents a resistance value of the wiring pattern 1. FIG. 4 illustrates a temperature characteristic of a wiring pattern 1 that is made from copper and that is manufactured so that a resistance value becomes 1 m$\Omega$ at 25° C. As illustrated in FIG. 4, the resistance value of the wiring pattern 1 has a substantially linear characteristic with respect to a temperature.

Figure 5:
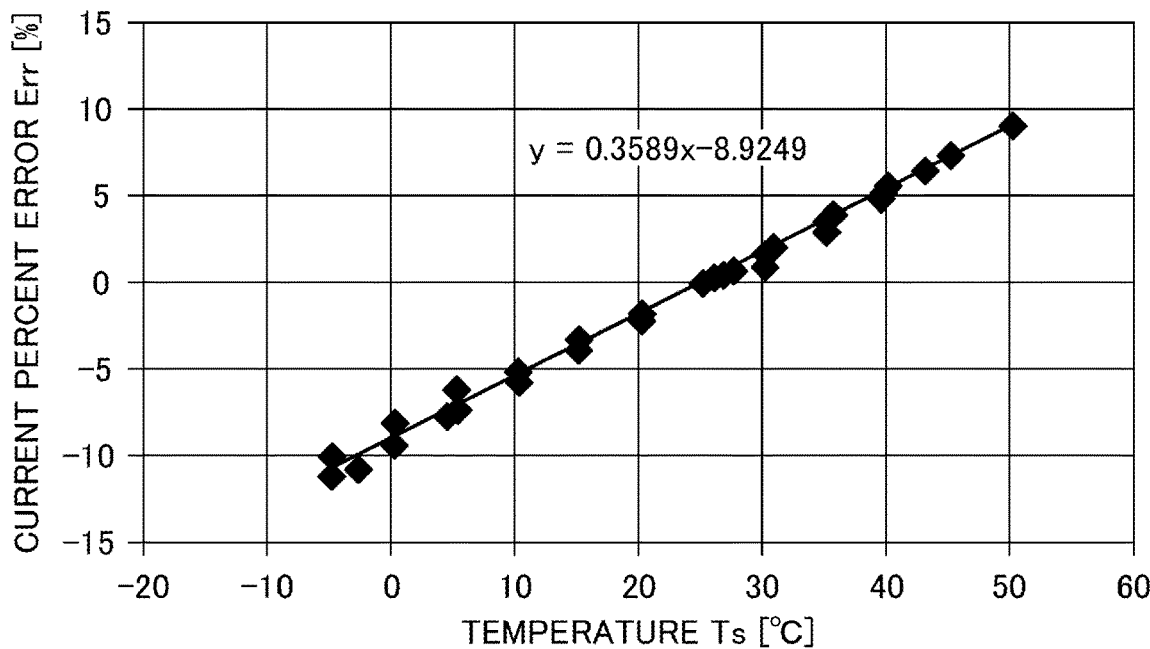
FIG. 5 is a diagram illustrating a relationship between a temperature and a percent error of an adjusted current value after resistance value variation of the wiring pattern caused by an individual difference in a circuit board is compensated.

FIG. 5 is a diagram illustrating a relationship between a temperature measurement value and a percent error of an adjusted current value (first adjusted current value) after the variation in the resistance value of the wiring pattern 1 caused by an individual difference in the circuit board 300-1 is compensated. A horizontal axis indicates a measured temperature Ts, and a vertical axis indicates a current percent error Err. Hereinafter, the temperature Ts is referred to as a temperature measurement value. The current percent error Err represents a percent error between the first adjusted current value Ia and a reference current value Ir (Err=(Ia−Ir)/Ir×100%). The reference current value Ir represents an amount of current flowing through the wiring pattern 1 when a temperature measurement value is equal to a reference temperature, for example, 25° C. As illustrated in FIG. 5, the current percent error Err has a substantially linear characteristic with respect to the temperature measurement value. Thus, because the current percent error Err has a substantially linear characteristic with respect to the temperature measurement, approximation formulas (Formulas 4 and 5) illustrated in FIG. 6, which will be described below, can be constructed. That is, the inspection device 70 stores coefficients a and b in Formula 4 into the second storage section 42 as second adjustment data for compensating for the resistance value variation caused by the temperature characteristic of the wiring pattern 1. In the case of FIG. 5, the approximation "y=0.3589x−8.9249" is established (y represents the current percent error Err, and x represents the temperature measurement value). 0.3589 is an example of the coefficient a, and −8.9249 is an example of the coefficient b.

Figure 6:
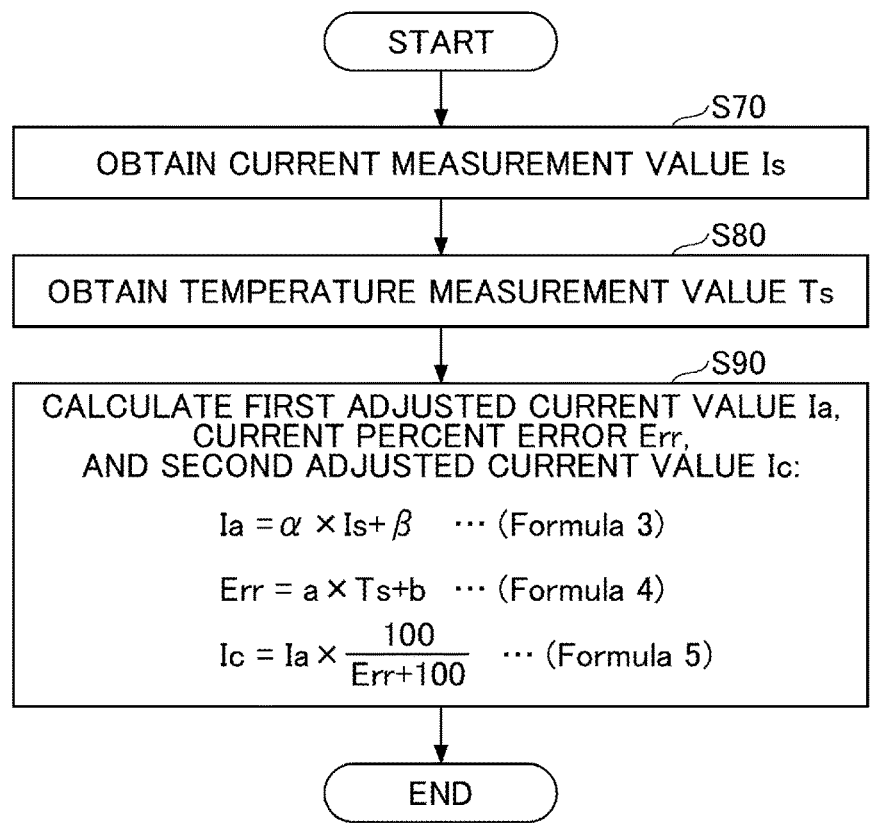
FIG. 6 is a flowchart illustrating a process for calculating the adjusted current value.

FIG. 6 is a flowchart illustrating a process for calculating a correction current value. Each step illustrated in FIG. 6 is performed, after shipment, by the CPU 50-1 provided on the circuit board 300-1.

At step S70, the CPU 50-1 acquires the current measurement value Is from the AD converter 60. The current measurement value Is is a value of current measured by the current measurement circuit 63, such as the first current measurement value I1s or the second current measurement value I2s described above. At step S80, the CPU 50-1 acquires the temperature Ts, which is the temperature measurement value, from the AD converter 60.

At step S90, the CPU 50-1 adjusts the current measurement value Is to calculate the first adjusted current value Ia, which is a current value after adjustment, by substituting, into Formula 3, the current measurement value Is, the gain $\alpha$ read out from the first storage section 41, and the offset $\beta$ read out from the first storage section 41. The CPU 50-1 also calculates the current percent error Err by substituting, into Formula 4, the temperature Ts, the coefficient a read out from the second storage section 42, and the coefficient b read out from the second storage section 42. Furthermore, the CPU 50-1 adjusts the first adjusted current value Ia to calculate the second adjusted current value Ic, which is a current value after adjustment of Ia, by substituting the first adjusted current value Ia and the current percent error Err into Formula 5. Accordingly, even if an error occurs in the current measurement value Is due to variation in resistance caused by a temperature characteristic of the wiring pattern 1, the CPU 50-1 can accurately calculate an amount of electrical current flowing through the specific section 2, as the second adjusted current value Ic. Therefore, measurement accuracy of an amount of current flowing through the wiring pattern 1 is improved. As a result, if the CPU 50-1 calculates, for example, a driving signal for driving the motor 400 based on the second adjusted current value Ic, accuracy of rotational speed control of the motor 400 improves.

Also, in the motor driving circuit 100-1, because a part of the wiring pattern 1 is used as the current measuring means instead of a chip resistor, manufacturing cost of the circuit board 300-1 on which the motor driving circuit 100-1 is implemented can be reduced. In addition, because the chip resistor is replaced with a part of the wiring pattern 1, operations for implementing the chip resistor to the circuit board 300-1 become unnecessary. Thus, a time of operations for implementing the chip resistor onto the circuit board 300-1 can be reduced, as compared to a case in which the chip resistor is implemented onto the circuit board 300-1.

Second Embodiment

Figure 7:
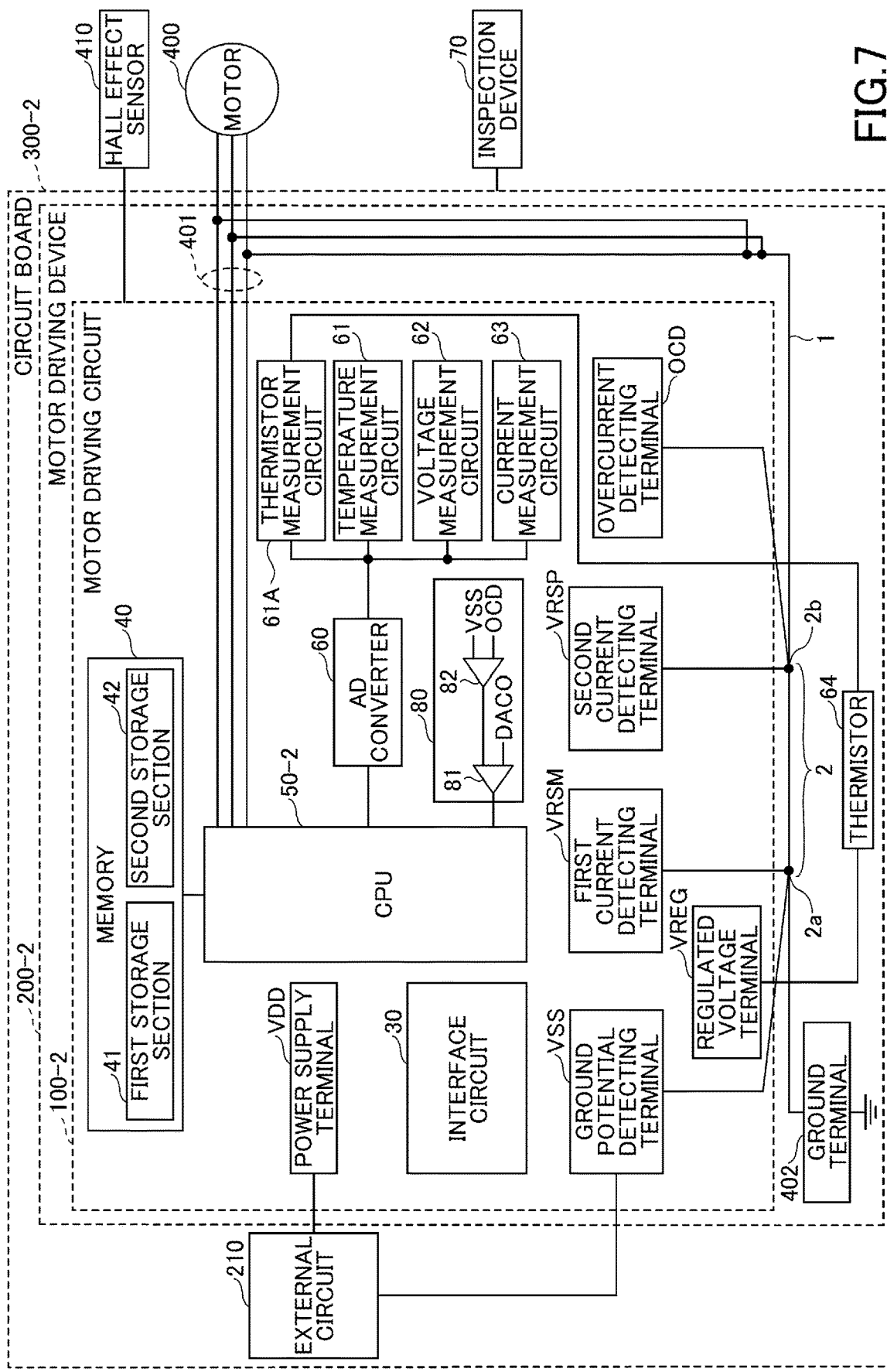
FIG. 7 is a diagram illustrating a configuration of a motor driving device according to a second embodiment of the present disclosure.

FIG. 7 is a diagram illustrating a configuration of a motor driving device according to a second embodiment of the present disclosure. Hereinafter, elements which are the same as that in the first embodiment are given the same reference symbols, the description of the elements will be omitted, and differences from the first embodiment will be described. On a circuit board 300-2 according to the second embodiment, which is illustrated in FIG. 7, a motor driving device 200-2 and an external circuit 210 are provided. The circuit board 300-2 is a printed circuit board made from glass epoxy for example. The motor driving device 200-2 includes a motor driving circuit 100-2 that measures current flowing through a wiring pattern 1 formed on the circuit board 300-2, and drives a motor based on a measured current value.

The motor driving circuit 100-2 includes, as internal circuits, an interface circuit 30, a memory 40, a CPU 50-2, an AD converter 60, a temperature measurement circuit 61, a thermistor measurement circuit 61A, a voltage measurement circuit 62, a current measurement circuit 63, and an overcurrent detection circuit 80. The motor driving circuit 100-2 also includes a thermistor 64 connected to the thermistor measurement circuit 61A, a ground potential detecting terminal VSS connected to the wiring pattern 1, and an overcurrent detecting terminal OCD connected to the wiring pattern 1. The thermistor 64 is a device whose resistance varies according to an ambient temperature. The ground potential detecting terminal VSS is connected to, for example, a first connecting point 2a on the wiring pattern 1. The overcurrent detecting terminal OCD is connected to, for example, a second connecting point 2b on the wiring pattern 1. The thermistor 64 may be disposed such that a distance from the thermistor 64 to a specific section 2 of the wiring pattern 1 is shorter than the shortest distance from the thermistor measurement circuit 61A to the specific section 2. For example, the thermistor 64 may be provided in contact with the specific section 2. The thermistor 64 is connected to a regulated voltage terminal VREG to which regulated voltage for pulling up the thermistor 64 is applied.

Because the thermistor 64 is disposed near the specific section 2, heat generated in the specific section 2 is easily transferred to the thermistor 64. The thermistor 64 outputs, as temperature information, voltage information corresponding to an ambient temperature of the specific section 2 to the thermistor measurement circuit 61A. The thermistor measurement circuit 61A converts the temperature information output from the thermistor 64 into voltage having a value capable of being input to the AD converter 60, and outputs the converted voltage as a temperature measurement value. The AD converter 60 converts the analog temperature measurement value output from the thermistor measurement circuit 61A to a digital value, and outputs the digital value to the CPU 50-2.

In the motor driving circuit 100-2 according to the second embodiment, because the thermistor 64 is disposed near the specific section 2, accuracy of detecting the temperature measurement value can be increased. Further, by using the thermistor 64 provided outside the thermistor measurement circuit 61A, the motor driving circuit 100-2 on the circuit board 300-2 does not need to be positioned to be close to the specific section 2. Therefore, freedom of implementation layout, such as layout of the motor driving circuit 100-2 on the circuit board 300-2, is improved. For example, design of the circuit in accordance with types of the motors 400 is simplified, and time for investigating the circuit design can be shortened. Also, the motor driving circuit 100-2 can be further downsized.

The overcurrent detection circuit 80 includes a differential amplifier 82 and a comparator 81 for determination of overcurrent. The differential amplifier 82 calculates a difference between an electric potential at the ground potential detecting terminal VSS and an electric potential at the overcurrent detecting terminal OCD, amplifies the calculated difference, and calculates the amplified voltage as an overcurrent determination value.

The comparator 81 receives the overcurrent determination value output from the differential amplifier 82 and a reference value DACO, which is a reference value for the overcurrent determination. The reference value DACO is a configurable value, by considering variation in resistance of the specific section 2 in the wiring pattern 1 caused by an individual difference in the circuit board 300-2, and variation in resistance of the specific section 2 caused by a temperature characteristic of the wiring pattern 1. For example, the reference value DACO may be modified by executing firmware stored in the memory 40. Overcurrent is current flowing when a ground fault occurs in the motor wiring 401 and current flowing when the motor 400 is in an overload state. The comparator 81 compares the overcurrent determination value with the reference value DACO, and outputs an overcurrent notification signal notifying that overcurrent has occurred when the overcurrent determination value becomes equal to or greater than the reference value DACO. When the CPU 50-2 receives the overcurrent notification signal, the CPU 50-2, for example, stops supplying power to the motor 400, and outputs information indicating that an overcurrent has occurred to the interface circuit 30.

Because the reference value DACO can be modified by the firmware, even if an amount of current flowing through the specific section 2 varies due to the variation in resistance in the specific section 2 of the wiring pattern 1, the reference value DACO corresponding to the amount of the current is used. Thus, erroneous detection of overcurrent by the CPU 50-2 can be prevented. The modification of the reference value DACO value is not limited to modification by firmware.

In the first and second embodiments, processes from step S10 to step S60 are performed by the inspection device 70. However, these processes may be embodied, for example, by firmware stored in the memory 40.

Current detected by the current measurement circuit 63 may be, for example, a sum of current of the three phases flowing through the wiring pattern 1, or phase current flowing in the motor wiring 401. Each of the circuit board 300-1 and the circuit board 300-2 is not limited to a single-layer circuit board, but may be a multi-layer circuit board having an inner layer circuit board and an outer layer circuit board. If the multilayer circuit board is used as the circuit board 300-1 and the circuit board 300-2, the wiring pattern 1 can be disposed inside the circuit board, thereby reducing an area of implementing parts outside the circuit board, and enabling downscaling of the circuit board 300-1 and the circuit board 300-2.

If measurement accuracy of current is low, accuracy of control of rotational speed of the motor 400 decreases. In addition, if the measurement accuracy of current is low, the motor 400 continues to operate in an event of overcurrent, and abnormal heat generation of the motor 400, damage to the motor 400, and the like may occur. On the other hand, in the motor driving circuits 100-1 and 100-2 according to the first and second embodiments, a current measurement value is adjusted based on the first adjustment data, and the motor 400 is driven based on an adjusted current value, which is the adjusted current measurement value. Accordingly, occurrence of abnormal heat generation of the motor 400, damage to the motor 400, and the like is suppressed, so that safety of control of the motor 400 can be ensured, and further, accuracy of control of rotational speed of the motor 400 can be improved. Measured current can be used for not only overcurrent detection but also adjustment of rotational speed of the motor 400.

Configurations described in the aforementioned embodiments are examples of the present invention. They may be combined with another known art, or a part of the configurations may be omitted or changed without departing from the gist of the present invention.

What is claimed is:

1. A motor driving circuit comprising:
a wiring pattern formed in a circuit board, the wiring pattern being configured such that electrical current flowing into a motor flows through the wiring pattern;
a current measurement circuit configured to measure an amount of electrical current flowing through the wiring pattern, based on an amount of voltage drop caused by the electrical current flowing through the wiring pattern;
a temperature measurement circuit configured to measure an ambient temperature of the wiring pattern; and
a drive unit configured
to adjust a current measurement value measured by the current measurement circuit, based on:
a gain and an offset that are set in advance according to the electrical current flowing through the wiring pattern to compensate for variation in resistance of the wiring pattern caused by an individual difference in the circuit board, wherein the current measurement value is multiplied by the gain, and the offset is added to the resulting product;
first adjustment data, which is configured by the gain and the offset;
a temperature measurement value that is the temperature measured by the temperature measurement circuit;
to drive the motor based on an adjusted current value which is the adjusted current measurement value;
to calculate a percent error between the adjusted current measurement value and a reference current value, based on the temperature measurement value, and
to adjust the adjusted current measurement value by using the percent error.

2. The motor driving circuit according to claim 1, wherein the drive unit is configured to adjust the current measurement value based on the first adjustment data, the temperature measurement value, and second adjustment data that compensates for variation in resistance of the wiring pattern caused by a temperature characteristic of the wiring pattern.

3. The motor driving circuit according to claim 2, wherein the first adjustment data includes a coefficient $\alpha$ and a coefficient $\beta$;
the second adjustment data includes a coefficient a and a coefficient b; and
the drive unit is configured to adjust the current measurement value in accordance with an expression of $\{(\alpha \times I + \beta) \times 100\}/\{(a \times T + b) + 100\}$, where I represents the current measurement value and T represents the temperature measurement value.

4. The motor driving circuit according to claim 1, wherein the circuit board is a multilayer circuit board.

5. The motor driving circuit according to claim 1, wherein the drive unit is implemented by firmware.

6. The motor driving circuit according to claim 1, wherein the drive unit is configured to stop supplying electric power to the motor or to output information indicating that overcurrent has occurred, in response to detecting that an overcurrent determination value becomes equal to or greater than a reference value for overcurrent determination; and
the reference value for overcurrent determination is configurable by execution of firmware.

7. A motor driving device including the motor driving circuit according to claim 1.

8. A motor driving circuit comprising:
a wiring pattern formed in a circuit board, the wiring pattern being configured such that electrical current flowing into a motor flows through the wiring pattern;
a voltage drop detection circuit configured to detect a voltage drop caused by the electrical current flowing through the wiring pattern, the voltage drop being detected by calculating a voltage difference between voltages applied to a first current detecting terminal and a second current detecting terminal connected to the wiring pattern;
a current measurement circuit configured to measure, based on an amount of the voltage drop, a first current measurement value when the electrical current flowing through the wiring pattern is a first current, or a second current measurement value when the electrical current flowing through the wiring pattern is a second current different from the first current;
a temperature measurement circuit configured to measure an ambient temperature of the wiring pattern; and
a drive unit configured to multiply a current measurement value measured by the current measurement circuit by a gain based on a difference between the first current measurement value and the second current measurement value, to adjust the product obtained by the multiplying of the current measurement value by the gain based on first adjustment data, which is configured by the gain and the offset;

a temperature measurement value that is the temperature measured by the temperature measurement circuit;

to drive the motor based on an adjusted current value which is the adjusted current measurement value;

to calculate a percent error between the adjusted current measurement value and a reference current value, based on the temperature measurement value, and to adjust the adjusted current measurement value by using the percent error.

9. A motor driving circuit comprising:

a wiring pattern formed in a circuit board, the wiring pattern being configured such that electrical current flowing into a motor flows through the wiring pattern;

a current measurement circuit configured to measure an amount of electrical current flowing through the wiring pattern, based on an amount of voltage drop caused by the electrical current flowing through the wiring pattern;

a temperature measurement circuit configured to measure an ambient temperature of the wiring pattern; and a drive unit configured to adjust a current measurement value measured by the current measurement circuit, based on:

a gain and an offset that are set in advance according to the electrical current flowing through the wiring pattern to compensate for variation in resistance of the wiring pattern caused by an individual difference in the circuit board, wherein the current measurement value is multiplied by the gain, and the offset is added to the resulting product;

first adjustment data, which is configured by the gain and the offset;

a temperature measurement value that is the temperature measured by the temperature measurement circuit; and second adjustment data that compensates for variation in resistance of the wiring pattern caused by a temperature characteristic of the wiring pattern, and to drive the motor based on an adjusted current value which is the adjusted current measurement value.

10. The motor driving circuit according to claim 9, wherein the first adjustment data includes a coefficient $\alpha$ and a coefficient $\beta$;

the second adjustment data includes a coefficient a and a coefficient b; and the drive unit is configured to adjust the current measurement value in accordance with an expression of $\{(\alpha \times I + \beta) \times 100\}/\{(a \times T + b) + 100\}$, where I represents the current measurement value and T represents the temperature measurement value.

11. The motor driving circuit according to claim 9, wherein the circuit board is a multilayer circuit board.

12. The motor driving circuit according to claim 9, wherein the drive unit is implemented by firmware.

13. The motor driving circuit according to claim 9, wherein the drive unit is configured to stop supplying electric power to the motor or to output information indicating that overcurrent has occurred, in response to detecting that an overcurrent determination value becomes equal to or greater than a reference value for overcurrent determination; and the reference value for overcurrent determination is configurable by execution of firmware.

14. A motor driving device including the motor driving circuit according to claim 9.

15. A motor driving circuit comprising:

a wiring pattern formed in a circuit board, the wiring pattern being configured such that electrical current flowing into a motor flows through the wiring pattern;

a voltage drop detection circuit configured to detect a voltage drop caused by the electrical current flowing through the wiring pattern, the voltage drop being detected by calculating a voltage difference between voltages applied to a first current detecting terminal and a second current detecting terminal connected to the wiring pattern;

a current measurement circuit configured to measure, based on an amount of the voltage drop, a first current measurement value when the electrical current flowing through the wiring pattern is a first current, or a second current measurement value when the electrical current flowing through the wiring pattern is a second current different from the first current;

a temperature measurement circuit configured to measure an ambient temperature of the wiring pattern; and a drive unit configured to multiply a current measurement value measured by the current measurement circuit by a gain based on a difference between the first current measurement value and the second current measurement value, to adjust the product obtained by the multiplying of the current measurement value by the gain based on first adjustment data, which is configured by the gain and the offset;

a temperature measurement value that is the temperature measured by the temperature measurement circuit; and second adjustment data that compensates for variation in resistance of the wiring pattern caused by a temperature characteristic of the wiring pattern, and to drive the motor based on an adjusted current value which is the adjusted current measurement value.

* * * * *